US007187305B2

(12) United States Patent
Ellis et al.

(10) Patent No.: US 7,187,305 B2
(45) Date of Patent: Mar. 6, 2007

(54) ENCODER FOR A MOTOR CONTROLLER

(75) Inventors: George Ellis, Blacksburg, VA (US); Siegfried Held, Donaueschingen (DE)

(73) Assignee: Kollmorgen Corporation, Simsbury, CT (US)

( * ) Notice: Subject to any disclaimer, the term of this patent is extended or adjusted under 35 U.S.C. 154(b) by 4 days.

(21) Appl. No.: 10/946,203

(22) Filed: Sep. 21, 2004

(65) Prior Publication Data

US 2006/0061489 A1 Mar. 23, 2006

(51) Int. Cl.
*H03M 1/22* (2006.01)
(52) U.S. Cl. ............... 341/14; 250/231.13; 250/231.16
(58) Field of Classification Search .................. 341/14, 341/7; 250/231.13, 231.16, 231.14; 356/150
See application file for complete search history.

(56) References Cited

U.S. PATENT DOCUMENTS

| | | | |
|---|---|---|---|
| 3,170,154 A * | 2/1965 | Fleming, Jr. ................... 341/7 |
| 3,244,895 A * | 4/1966 | Anderegg, Jr. ............... 356/150 |
| 3,482,106 A * | 12/1969 | Anderegg, Jr. et al. . 250/231.16 |
| 3,544,800 A * | 12/1970 | Elliott .................... 250/231.14 |
| 3,636,365 A * | 1/1972 | Houston, Jr. ........... 250/227.26 |
| 4,259,570 A | 3/1981 | Leonard |
| 4,266,125 A | 5/1981 | Epstein et al. |
| 4,321,531 A | 3/1982 | Marshall |
| 4,559,524 A | 12/1985 | Suzuki |
| 4,691,101 A | 9/1987 | Leonard |
| 4,757,196 A * | 7/1988 | Yamada et al. ........ 250/231.13 |
| 5,073,710 A * | 12/1991 | Takagi et al. .......... 250/231.14 |
| 5,696,373 A | 12/1997 | Fujui et al. |
| 6,522,130 B1 | 2/2003 | Lutz |
| 6,774,355 B2 * | 8/2004 | Kudo .................... 250/231.13 |
| 2002/0067855 A1 * | 6/2002 | Chiu et al. |

FOREIGN PATENT DOCUMENTS

| | | |
|---|---|---|
| JP | 60146113 | 8/1985 |
| JP | 6182643 | 4/1986 |
| JP | 1191017 | 8/1989 |

OTHER PUBLICATIONS

"Notification of Transmittal of the International Search Report and the Written Opinion of the International Searching Authority, or the Declaration" mailed on Jan. 4, 2006 for International Application No. PCT/US05/33953.
"International Search Report" mailed on Jan. 4, 2006 for International Application No. PCT/US05/33953.
"Written Opinion of the International Searching Authority" mailed on Jan. 4, 2006 for International Application No. PCT/US05/33953.

* cited by examiner

*Primary Examiner*—Jean Bruner Jeanglaude
(74) *Attorney, Agent, or Firm*—Morgan & Finnegan, LLP

(57) ABSTRACT

An encoder in a motor system measures radial movement and translational movement of a disk with a single integrated sensor disposed on a microprocessor chip. The encoder measures position information and eccentric movement of the disk by the integrated sensor. The measured positional information and eccentric movement information are then combined generating single corrected positional information of the disk. The corrected single positional information may be provided to a user in standard format for operation of the motor system.

30 Claims, 7 Drawing Sheets

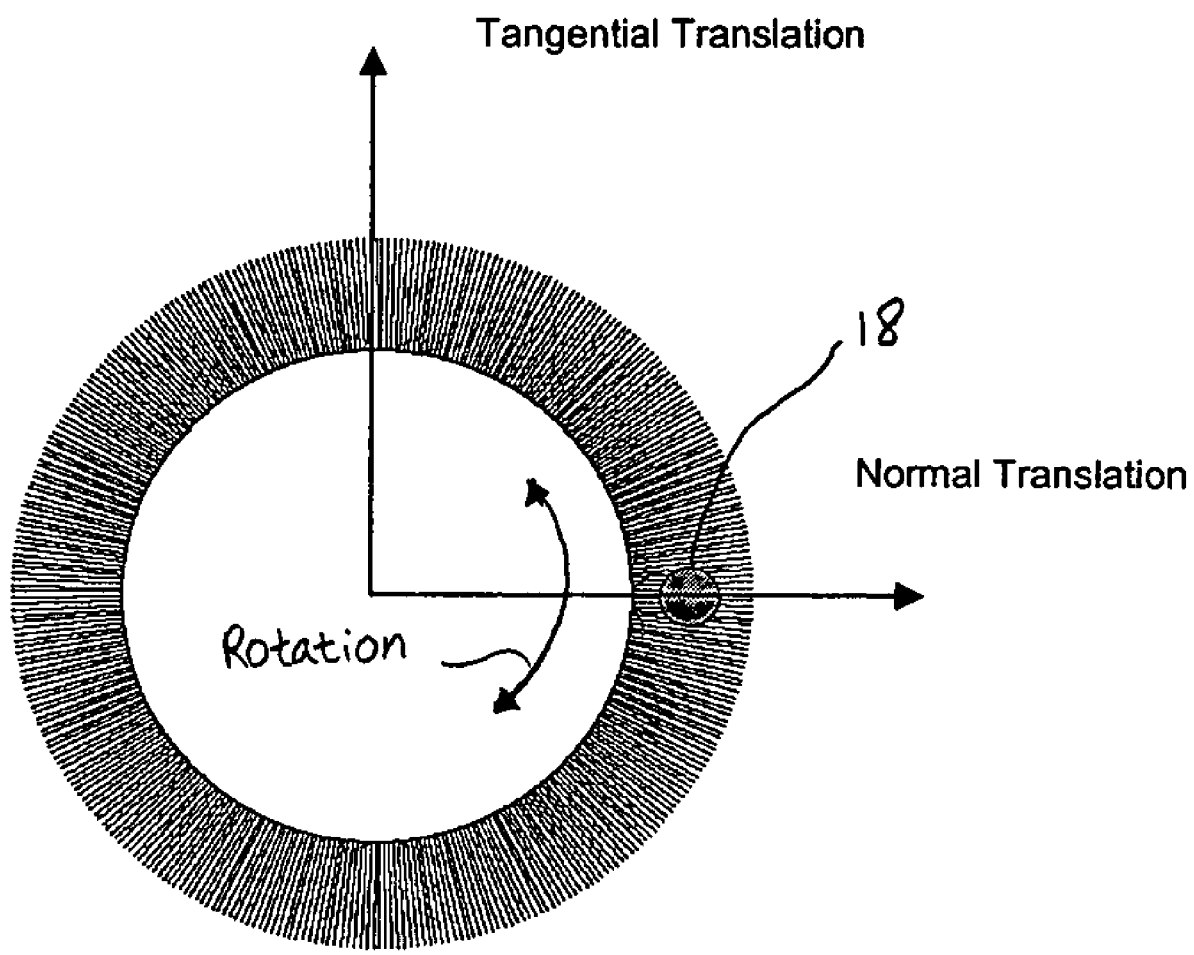
FIG. IC PRIOR ART

ENCODER FOR A MOTOR CONTROLLER

FIELD OF THE INVENTION

This invention relates to a method and system for an encoder mounted on the shaft of a motor. More particularly, the present invention relates to an encoder having a provision by which an eccentric movement of the motor shaft can be compensated.

BACKGROUND OF THE INVENTION

Encoders (or resolvers) have been used in motor systems, such as brushless DC servomotors, to control the operation of the motor system. An encoder is used to provide position and speed information of a rotor of the motor system. This information is used by an external motor controller having electronics to control the operation of the motor system.

Rotary optical encoders such as housed encoders are commonly used in motor systems to provide the rotary position of the motor system. A rotary optical encoder typically includes a housing to support precision bearings and electronics, a shaft with a disk (e.g., an optical disk) having alternating clear and opaque patterns, a light source (e.g., a Light Emitting Diode), and an assembly of a photodetector and a mask. A beam of light produced by the light source is projected onto the optical disk, which is constructed of a clear material with opaque radial lines. When the optical disk rotates, the light beam passes through the clear areas but is blocked by the opaque areas so that the optical disk effectively modulates the light beam. The pulsed light beam is then received by the mask/photodetector assembly where electric signals are generated and provided to a motor controller.

Another type of rotary optical encoder, called a kit encoder, is also widely used in motor systems. Instead of having a separate housing, shaft, and bearings for the housed type rotary encoder, the kit encoder relies on the motor shaft, i.e., the disk is mounted on the shaft of the motor itself in the kit encoder. Other elements of the kit encoder such as the light source and the mask/photodetector assembly are mounted to the motor housing.

Kit encoders have significant advantages over housed encoders. In particular, overall system size and manufacturing cost is reduced because numerous components such as the encoder shaft and precision bearings are not required. However, the accuracy of the kit encoder suffers because the motor shaft on which the optical disk is mounted has limited precision. For example, the shaft on which the optical disk is mounted in the kit encoder is particularly subject to eccentric movement. The dimensional tolerances of the components can allow eccentric motion such as when the center of the disk pattern and the shaft center are not coincident. This occurs on all encoders, but is exaggerated on kit encoders because the motor shaft normally has poorer dimensional control than do the shafts of housed encoders. Varying shaft side loads (i.e., forces normal to the motor shaft) can translate the shaft center also causing eccentric motion. This eccentric movement creates errors in measuring the rotational position of the motor shaft. The errors are generated predominantly at a frequency of one cycle per shaft revolution of the motor and are approximately equal in magnitude to the magnitude of eccentric movement.

FIG. 1A is a schematic diagram of a conventional transmissive type encoder 10 showing simplified elements such as a light source 12, a disk 14, a mask 16 and a photodetector 18. FIG. 1B is a plan view of the encoder 10 of FIG. 1A without the light source 12 shown for simplicity, i.e., only the disk 14, the mask 16 and the photodetector 18 are shown as overlapped. As shown in FIG. 1B, a disk is patterned with radial lines pattern formed of alternately clear area and opaque radial lines. The mask is designed to have a line pattern as similar as possible to a relevant portion of the radial lines of the disk.

As the disk rotates with the light source turned ON, the light beam passes through the clear areas of the disk and are blocked by the opaque lines. Subsequently, the non-blocked light from the disk arrives at the mask. When the clear areas of the disk are directly over the clear areas of the mask, about 50% of the incident light in the patterned area gets through to the photodetector. However, when the opaque lines of the disk are directly over the clear areas, nearly no light will get through to the photodetector. The photodetector generates electric signals proportional to the strength of the received light beam, which varies approximately as a sine wave when the disk rotates at constant speed. These electric signals are processed by external circuitry to calculate the rotational position of the disk (i.e., rotor position). Most encoders sense an incremental position relative to an arbitrary starting point which is normally the position of the disk when power is applied. An optional reference mark may be placed on the disk to indicate position of the disk within a single revolution. The position of the encoder may then be calculated in relationship to that reference.

The position provided by a conventional encoder is corrupted by eccentric movement, i.e., small eccentric movement that causes the disk to translate as it rotates. As shown in FIG. 1C, there are three types of disk motion created by shaft rotation, i.e., disk rotation, normal translation and tangential translation. The disk rotation is the primary motion to be sensed, and ideally, the encoder would sense only rotation. However, the disk may be translated normal to the mask as well as tangential to the mask. Tangential translation causes the radial lines on the mask to move relative to each other just as rotation does. In fact, in most encoders, tangential translation cannot be differentiated from rotation. In such a case, tangential translation corrupts the encoder output. Note that normal translation does not cause the lines in the disk and mask to move relative to each other and so does not corrupt the encoder output. Eccentric motion is approximately circular, causing both tangential and normal translation. For example, if the disk were offset 0.002" in the normal direction at zero degrees (e.g., at 3 o'clock position where the sensor 18 is located), the normal translation would be approximately $0.002 \cos(\theta)$ and the tangential translation would be approximately $0.002 \sin(\theta)$ where $\theta$ is the angle of disk. The tangential translation adds directly to the position output resulting in a feedback position approximately equal to the sum of the actual position and the tangential translation divided by the radius. Some applications may not tolerate these errors and thus a user might forced to use a higher precision encoder, for example, changing from a kit encoder to a housed encoder or increasing the precision of manufacture of a housed encoder. Such changes may increase the cost or size of the encoder, or require the user to accept other undesirable qualities of the position sensor.

SUMMARY OF THE INVENTION

The above-identified problems are solved and a technical advance is achieved in the art by providing a method and system that detects eccentric movement of a motor shaft and dynamically compensates for the errors caused by the eccentric movement.

In accordance with an aspect of the invention, there is provided an encoder comprising a light source (e.g., Light Emitting Diode or Laser Diode), a patterned disk with both radial lines and circular lines to measure both the tangential movement and normal movement of the disk, a mask corresponding to a portion of the patterned disk having radial lines and circular lines, and a sensor with a plurality of detectors for detecting the light signals from the mask that reflect the rotational movement and the translational movement of the patterned disk, wherein the sensor further includes electronic circuitry that processes the signals generated by the sensor.

In accordance with another aspect of the invention, the encoder measures two position signals with one sensor. The first signal, called the approximate rotation signal, is the sum of rotation and tangential translation. The second signal is the normal translation. The normal translation signal can be used to remove a tangential translation component of a position signal, thus improving the accuracy of the rotation signal, specifically removing the corrupting effects of eccentric motion. As a result, the encoder of the present invention outputs rotational position information with improved accuracy.

Other and further aspects of the present invention will become apparent during the course of the following detailed description and by reference to the attached drawings.

BRIEF DESCRIPTION OF THE DRAWINGS

FIGS. 1A, 1B and 1C illustrate simplified structure of a prior art transmissive type encoder (FIGS. 1A and 1B) and three types of disk motion created by shaft rotation (FIG. 1C);

DETAILED DESCRIPTION

Figure 1A:
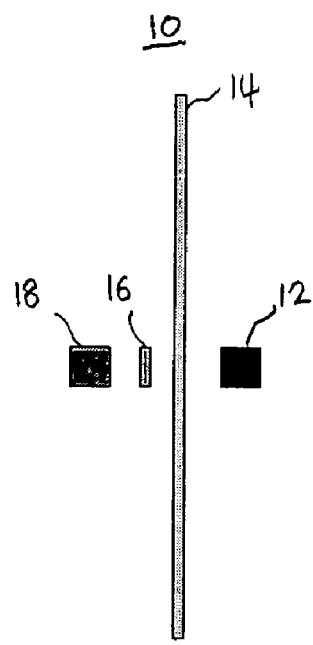
Figure 1B:
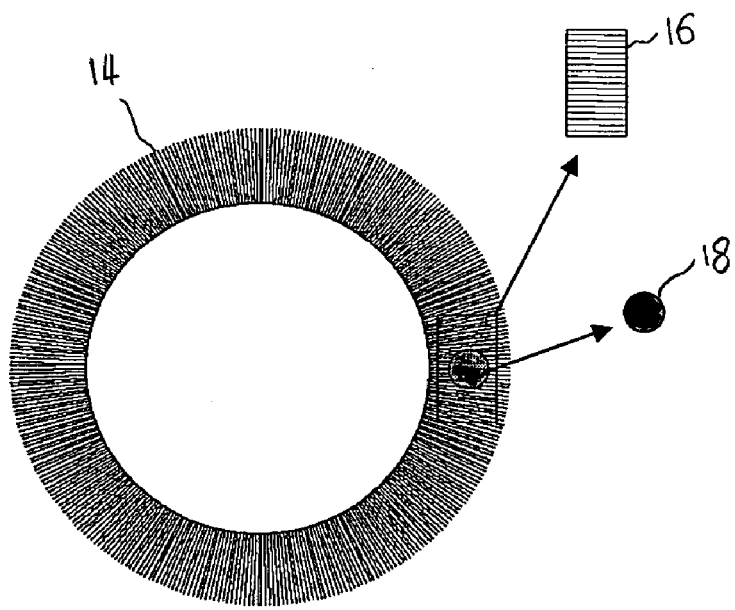

As discussed briefly above, while normal translation of the disk does not affect the light pattern generated by the radial lines of the disk and thus does not corrupt the rotational position information of the encoder as sensed by the radial lines, tangential translation of the disk will corrupt the sensed rotational position information of the encoder.

A conventional approach to this problem would be using an additional sensor located on the radius of the circular line pattern at an angle 90° from the radial line sensor. In this manner, tangential translation of the disk may be sensed and directly deducted from the positional information sensed from the radial lines. However, using an additional sensor in an encoder is disadvantageous for several reasons including increased cost and size of the motor system.

One aspect of the encoder of the present invention is using a single integrated sensor that measures both the approximate rotation (i.e., the sum of rotational information and tangential translation) and normal translation by measuring the effects in a single area of the disk. The normal translation is read and stored first. This stored information is applied when the motor has rotated 90° (as indicated by the radial line sensor) from the position where the normal translation was measured. The stored normal translation is used to compensate the positional information sensed by the radial line sensor for error caused by eccentric motion of the disk. This is based on the approximation that all disk translation is caused by eccentric motion so that the normal translation will appear as tangential translation after the disk has rotated 90°. The integrated sensor then generates a single corrected rotational value using the stored normal translation of the disk. This single corrected rotation value may be provided to motor control electronics in standard encoder format for control of the motor system. The encoder of the present invention allows estimation of the corrected position value using only a single sensor for measurement. Using a single integrated sensor of the present invention may be advantageous for cost and space issues since the encoder of the present invention may not add significant cost or space over existing encoders.

The single integrated sensor of the encoder of the present invention is further configured to combine the approximate rotational signal and the normal translation signal to generate a single corrected position value of the disk. The corrected position value may be formatted in a standard encoder format for a user. It should be understood that while this discussion focuses on providing processing of the single corrected position value in an integrated sensor having a processing chip and photo sensors thereby outputting a single corrected rotational signal by itself, this invention is equally applicable to using a separate processing chip from the photo sensors and providing the approximate rotation signal and the normal translation signal from the photo sensors to the separate processing chip for an external processing. This invention is further configured to use an integrated sensor and providing the approximate rotation signal, and storing the normal translation signal and outputting it after 90° of disk rotation as the approximate tangential translation for external processing.

Figure 2:
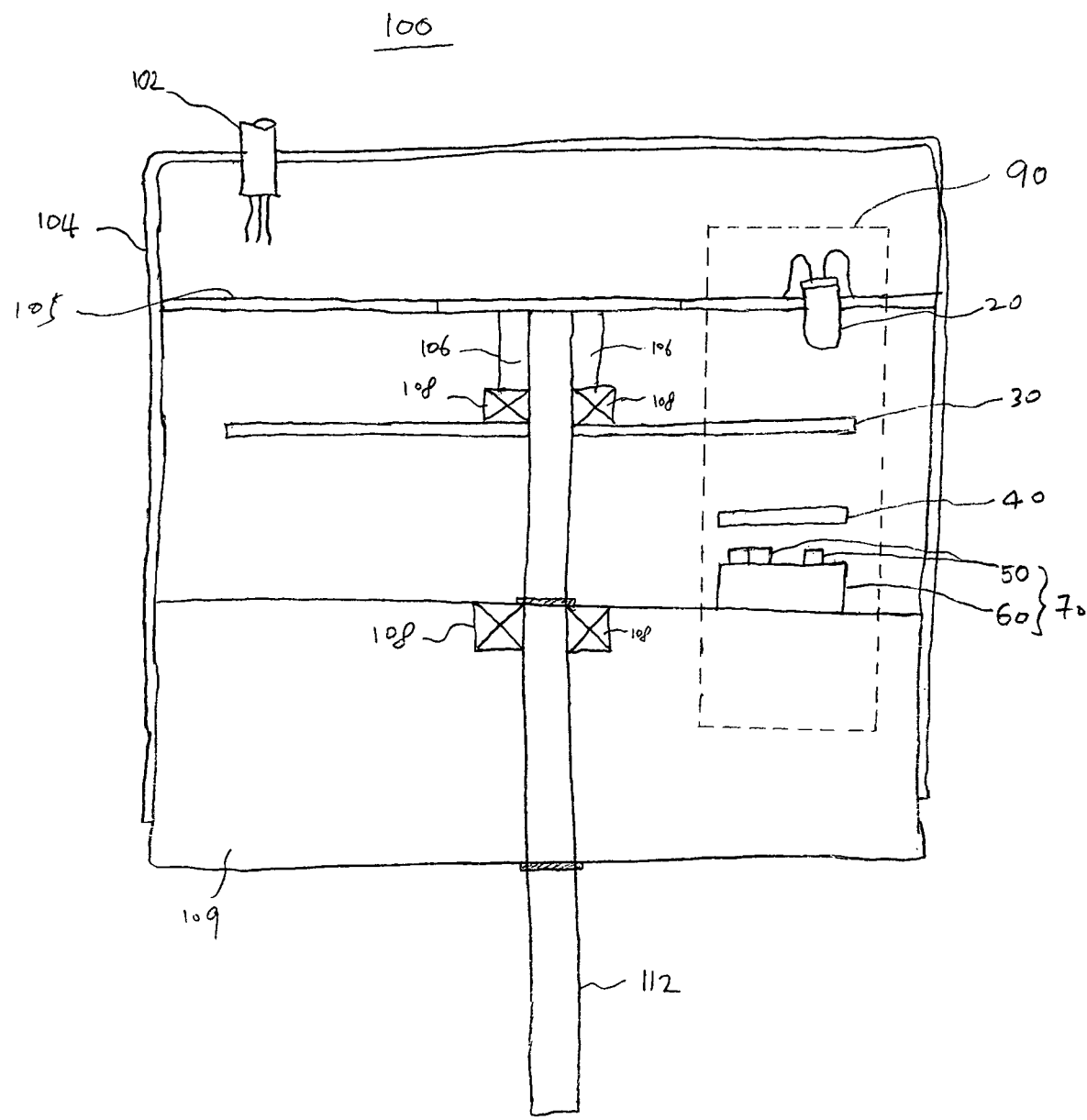
FIG. 2 is a cross-sectional view of a motor system having a built-in kit encoder of the present invention as an embodiment.

FIG. 2 is a cross-sectional view of a motor system 100 having a built-in kit encoder 90 of the present invention as an embodiment. The motor system includes a housing 104 through which an electrical cable 102 feeds electricity to the motor system. Reference numeral 105 represents a printed circuit board (PCB) in which a light source 20 such as LED (light-emitting diode) or LD (laser diode) of the encoder 90 is disposed. Reference numerals 106 and 108 represent a boss and a bearing 108 of the motor system 100, respectively, fixed to the center of a patterned disk 30. Reference numerals 109 and 112 represent a motor body and a shaft, respectively. The motor system 100 further includes a patterned mask 40 and an integrated sensor 70 on which a plurality of detectors 50 and a microprocessor system 60 are disposed. The light source 20, patterned disk 30, patterned mask 40 and integrated sensor 70 are aligned in an optical path.

Figure 3A:
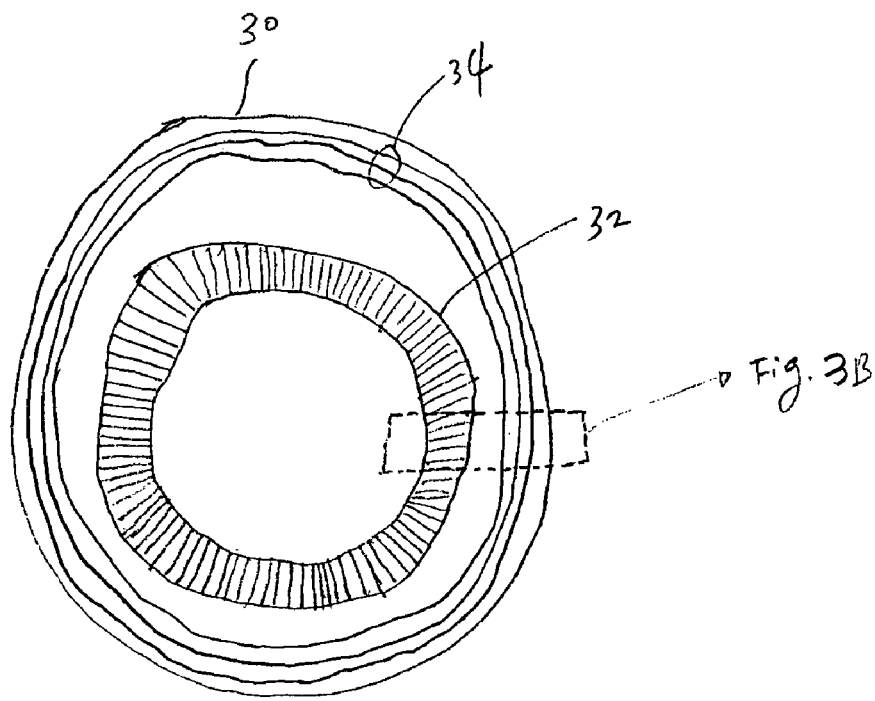
FIGS. 3A and 3B illustrate a disk having patterns according to the present invention.

FIG. 3A illustrates the patterned disk 30 designed according to an embodiment of the present invention. The disk is patterned with inner radial line pattern 32 and outer circular ring pattern 34. The number of outer rings in the pattern may vary depending on the required resolution of measurement and the maximum total amount of eccentric motion the encoder must tolerate. In the simplest case, only one ring line is required. The patterns may be formed with a metal layer on a glass surface using a vacuum equipment (e.g., a sputtering machine) and photolithography techniques (e.g., patterning and etching). For example, a chrome layer may be formed on an entire glass surface by a sputtering machine. Subsequently, photoresist is applied to the chrome layer and the glass/chrome/photoresist assembly is exposed to an ultra violet (UV) light using a patterned photomask having the radial line pattern 32 and circular line pattern 34. The exposed assembly then may be dipped into a developer and an etching solution consecutively to remove undesired portions of the chrome layer on the glass. This forms a pattern where the etched out portions of the assembly are clear leaving the remaining portions opaque. Photolithography is well known in the art and therefore detailed description of the process is omitted.

Figure 3B:
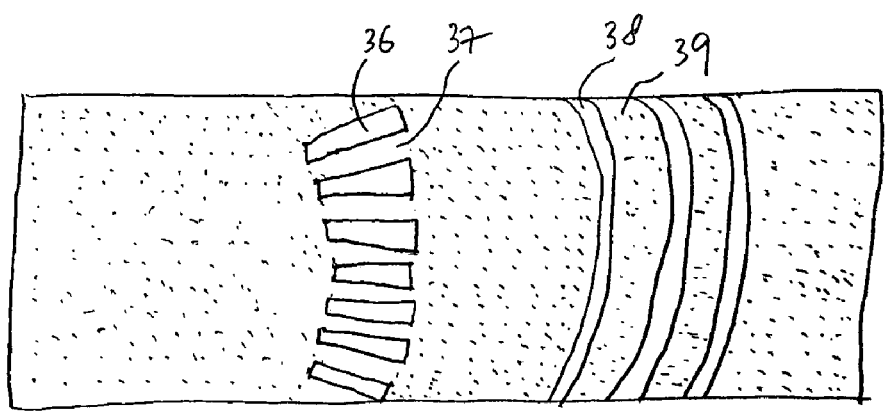

FIG. 3B illustrates a portion of the patterned disk 30 showing the radial line pattern 36 and ring pattern 38 of FIG. 3A in more detail. As shown in the figure, the patterned disk comprises alternating clear sections 36, 38 and opaque sections 37, 39. One clear section 36 and one opaque section 37 of the radial lines make up one pitch of the radial lines (i.e., 360° in optical units). Similarly, one clear section 38 and one opaque section 39 of the circular lines make up one pitch of the circular line pattern. Alternatively, the clear and opaque sections of the disk pattern may be designed in an opposite way. Each of the radial lines normally has an arc shape since the lines are located immediately adjacent to one another on a circular track.

Figure 4:
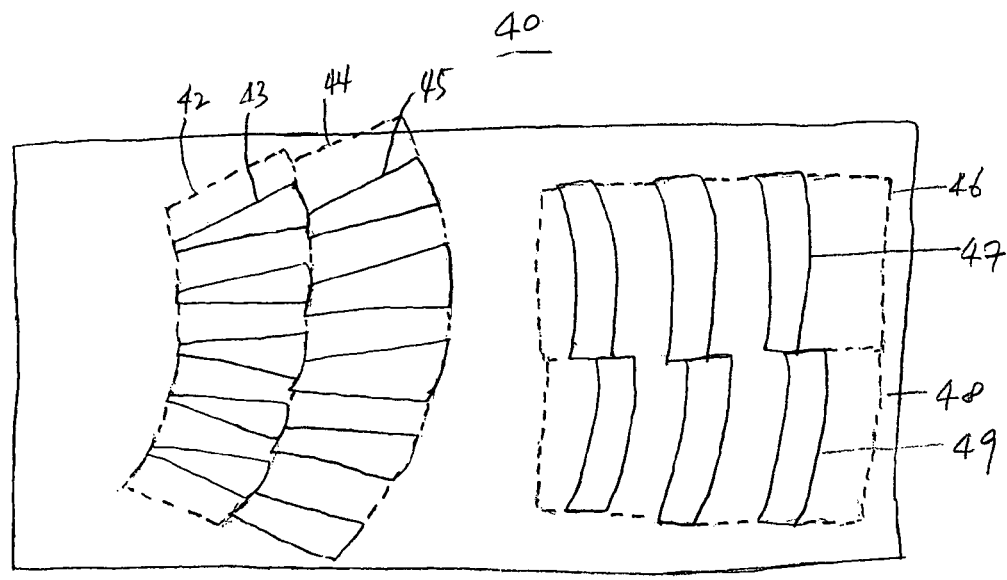
FIG. 4 illustrates a mask having patterns according to the present invention.

FIG. 4 illustrates a detailed structure of the mask 40 having patterns according to the present invention. The mask pattern generally follows a portion of the patterned disk as discussed above having multiple radial lines 43, 45 and a plurality of partial circular lines 47, 49. The radial mask lines, corresponding to radial lines on the disk, are used to measure the approximate rotation of the disk. The partial circular mask lines, corresponding to circular lines on the disk, are used to measure normal translation of the disk. Since the light signal from only one of the clear sections of the patterned disk may not be sufficiently strong, the mask is designed to receive light signals from multiple adjacent transmissive sections of the same phase and thus improve the detection sensitivity. The mask pattern may also be formed in a similar way to the disk patterning as discussed above, e.g., a metal coating on a glass surface using a vacuum equipment and subsequent photolithography techniques for patterning. In an embodiment, the mask pattern may be painted directly onto the glass that encases the sensor 50, i.e., the mask 40 and the integrated sensor 70 are integrated into one device.

The mask 40 is designed in such a way that it gives directional information of the disk, i.e., a clockwise or counter-clockwise direction for the rotational movement and a positive or negative direction for the eccentric movement of the disk. As shown in the figure, there are two columns of arrays 42, 44 and each of the horizontal lines 43 of array 42 is shifted 90° optically from horizontal lines 45 of array 44 to provide a two-channel output providing the direction of rotational movement of the disk. As a result, the transmitted light signals from array 42 will have a 90° phase difference compare to the transmitted light signals from array 44. The phase difference of the light signals from the arrays 42, 44 is presented in the output signals from the corresponding detectors 52, 54, as described below, enabling determination of the direction of the rotational movement (i.e., a clockwise or a counter-clockwise rotation) as well as the position information of the disk.

Similar to arrays 43, 45 as described above, there are two rows of arrays 46, 48 in the mask 40 and each of the partial circular lines 47 of array 46 is shifted 90° optically from the partial circular lines 49 of array 48 to provide a two-channel output measuring the direction of the normal translation of the disk. As a result, the transmitted light signals from array 46 will have a 90° phase difference compare to the transmitted light signals from array 48. The phase difference of the light signals from the arrays 46, 48 is presented in the output signals from the corresponding detectors 56, 58, as described below, enabling determination of the direction of the eccentric movement of the disk (i.e., a positive or a negative direction). Note that if the maximum eccentric motion is sufficiently small, multiple lines are not required to determine direction of eccentric motion. In such a case, the number of circular lines can be reduced to one line on the disk and corresponding one line on the mask.

Figure 5:
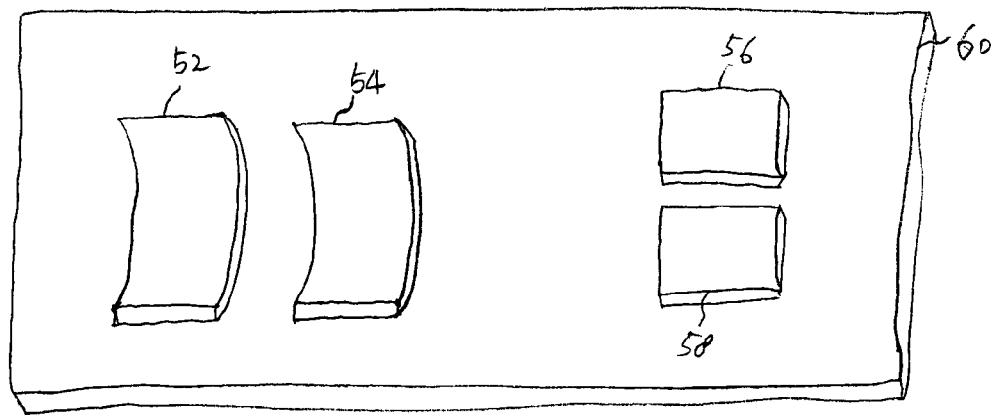
FIG. 5 illustrates an integrated sensor according to the present invention.

FIG. 5 illustrates a layout of the integrated sensor 70 designed according to an embodiment of the present invention. The integrated sensor includes detectors 52, 54 associated with the two column arrays 42, 44 of the mask 40 detecting light signals from the two column arrays, respectively. The integrated sensor also includes detectors 56, 58 associated with the two row arrays 46, 48 of the mask 40 detecting light signals from the two row arrays, respectively. The integrated sensor further includes microprocessor components forming a microprocessor system represented as 60, which processes and stores the output signals from the detectors. The detectors and the microprocessor system can be integrated into the same chip as shown in the figure and are constructed using standard semiconductor fabrication techniques. Alternatively, the microprocessor system may be built separately from the detectors, internally or externally to the encoder system.

Figure 6:
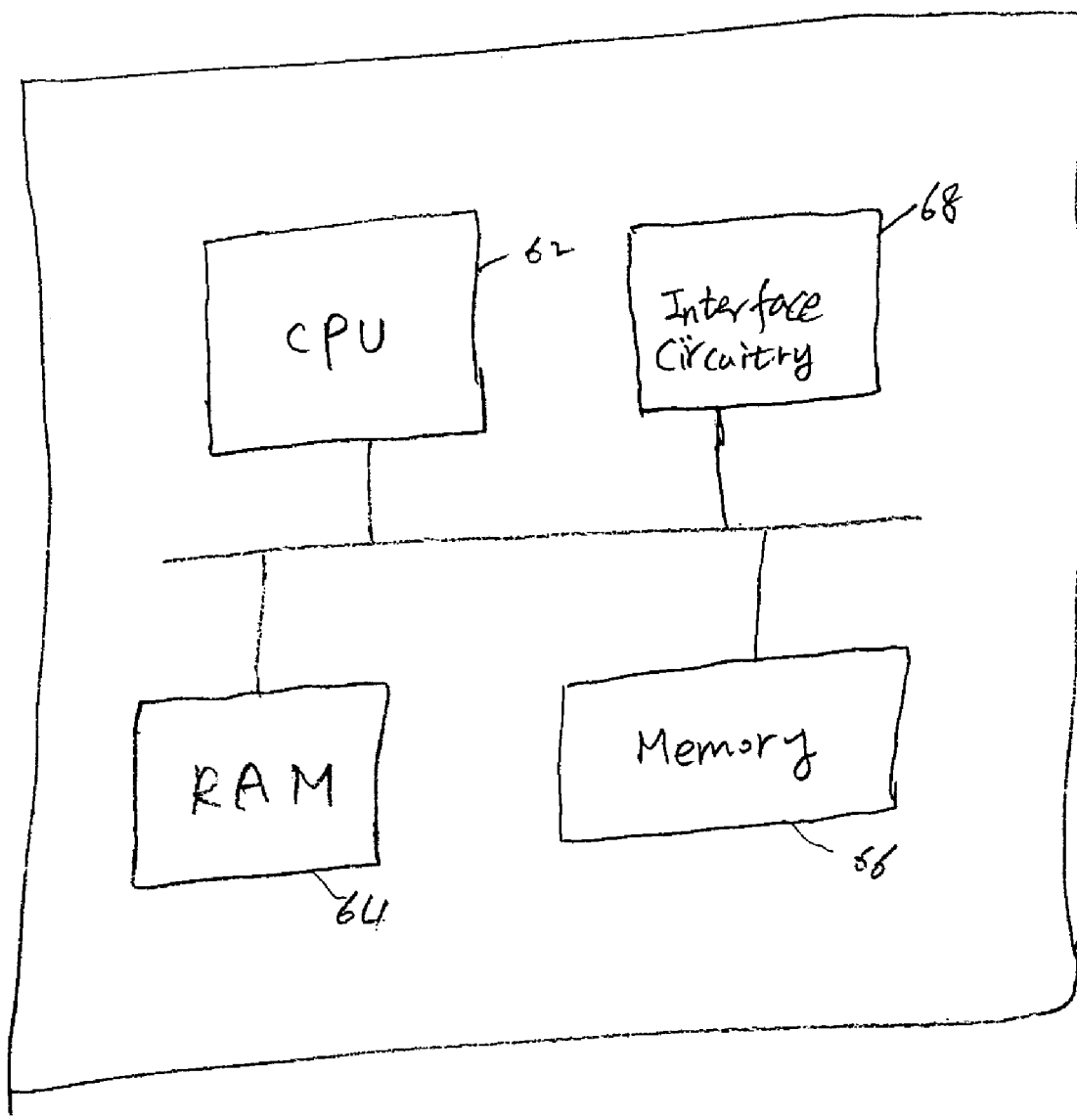
FIG. 6 is a block diagram of a microprocessor chip of the integrated sensor according to the present invention.

FIG. 6 is a block diagram of a microprocessor system 60 of the integrated sensor 70 according to an embodiment of the present invention. The microprocessor system (i.e., a chip) includes a CPU 62, a RAM 64, a Memory 66, and an Interface Circuitry 68 (e.g., an ASIC with analog and/or digital logic) interconnected by system bus lines. Upon receiving the electric signals from detectors 52, 54, 56, 58, via the Interface Circuitry, the chip processes the signals and outputs the corrected position and/or speed information of the disk, compensating for error induced by eccentric motion of the disk. It should be understood that this invention is equally applicable as none, some, or all of the microprocessor components may be integrated with the sensor onto a single chip.

The operation of the encoder 90 of the present invention as implemented in a motor system 100 is now described.

It is assumed that the patterned mask 40 and the integrated sensor assembly 70 of the encoder 90 of the present invention are located at a 3 o'clock position (0°) of the circular patterned disk 30 measuring the rotational movement as well as an eccentric movement of the disk. As the patterned disk of the motor system rotates along with the shaft 112 of the motor system 100, light from the light source 20 is transmitted through the clear areas of the patterned disk producing light pulses. Subsequently, transmitted light pulses with the same phase are passed through the aligned mask 40 and then detected by the detectors 52, 54, 56, 58 of the integrated sensor 70. The microprocessor system 60 of the integrated sensor, upon receiving electric signals from the detectors, processes the signals and outputs measurement of rotational position. The general operation of an encoder for detecting the position information of a disk including the direction information is well known in the art and more detailed description of the operation is omitted. For example, U.S. Pat. No. 4,476,457 to Kondo describes the basic operation of a rotary encoder, the disclosure of which is hereby incorporated by reference. While this discussion focuses on kit encoders, it should be understood that the invention is not limited to systems that use kit encoders. For example, the operation of a housed encoder is equivalent.

As the patterned disk 30 rotates with the light source 20 turned ON, light is passed through the clear areas of the circle pattern 38 of the disk. If there is no normal translation of the disk, there is no variation in the output from the associated detectors 56, 58 of the integrated sensor 70. If, however, there is normal translation in the disk, the output from the detectors will vary as the disk rotates because the overlapped areas between the clear sections 38 of the circle lines in the disk and mask pattern 47, 49 vary the transmitted light in accordance with the normal translation of the disk. The output signals from the detectors will follow the intensity (i.e., amount) of the transmitted light. These signals are processed to measure the magnitude and direction of normal translation of the patterned disk.

Upon measuring the normal translation of the disk 30, the microprocessor 60 of the integrated sensor 70 stores this data for later use. The processor estimates the tangential translation of the disk in the current position using the measured normal translation of the disk when the disk was 90° from the current location. This estimation of tangential translations is made assuming that the translation of the patterned disk is eccentric, i.e., that it follows a circular track. For example, by knowing that the normal translation of the disk is maximum at the point when the disk is at 0° (e.g., a 3 o'clock position), the processor estimates the maximum vertical translation (i.e., a tangential translation) would occur when the disk was at 90°. Table 1 shows an exemplary relationship between the normal and tangential translation of the disk assuming a magnitude 0.002 inches.

TABLE 1

| Approximate Rotational Position | Normal Translational | Estimated Tangential Translation |
|---|---|---|
| 0° | +0.002" | 0 |
| 90° | 0 | +0.002" |
| 180° | −0.002" | 0 |
| 270° | 0 | −0.002" |
| 360° | +0.002" | 0 |

In this example, the maximum normal translation of the disk follows an approximate cosine wave function starting at 0° while the tangential translation of the disk follows an approximate sine wave function starting at 0°. The estimation of the tangential translation may be performed at more points of the circular track of the disk (e.g., 0°, 45°, 90°, 135°, 180°, 225°, 270° and 315°) enabling a smoother compensation for any eccentric movement. Note that this system can measure the normal translation of the disk dynamically as the disk rotates, correcting the tangential translation of the disk accordingly based on the most recent reading of the normal translation of the disk from 90° before the current position. It can also rotate the motor or housed encoder separately, e.g., at time of manufacture or installation, and then correct for tangential translation based on those earlier measurements.

Upon estimating the tangential translation of the disk 30 from the measured normal translation, the microprocessor 60 of the integrated sensor 70 corrects the measured position information of the effects of eccentric movement from the measured position information. The microprocessor may combine the two values (i.e., approximate position and normal translation of the disk) together to generate a single corrected rotational position value for of the disk. As an example, the corrected position value for the disk ($\theta_{OUTPUT}$) may be calculated using the following formula:

$$\theta_{OUTPUT} = \theta_{AQB} + \sin(\theta_{AQB} + \theta_{OFFSET}) \times P_{TT}/T_{RADIUS} \quad (1)$$

where $\theta_{AQB}$ indicates uncorrected rotation information, $\theta_{OFFSET}$ is the offset angle of the eccentric motion with respect to 0° on the disk, $P_{TT}$ indicates the magnitude of tangential translation caused by the eccentric movement of the disk, and $T_{RADIUS}$ indicates a radius of the circular pattern on the disk.

As discussed above, the microprocessor 60 may correct the position information of the disk 30 dynamically throughout the rotation of the disk. For example, following a sine wave function, the microprocessor may add or subtract the estimated eccentric movement information of the disk (i.e., tangential movement) to the measured position information at various estimated points throughout the circular track of the disk performing the correction in a dynamic fashion ideally updating the correction very rapidly (e.g., every few microseconds).

Figure 7:
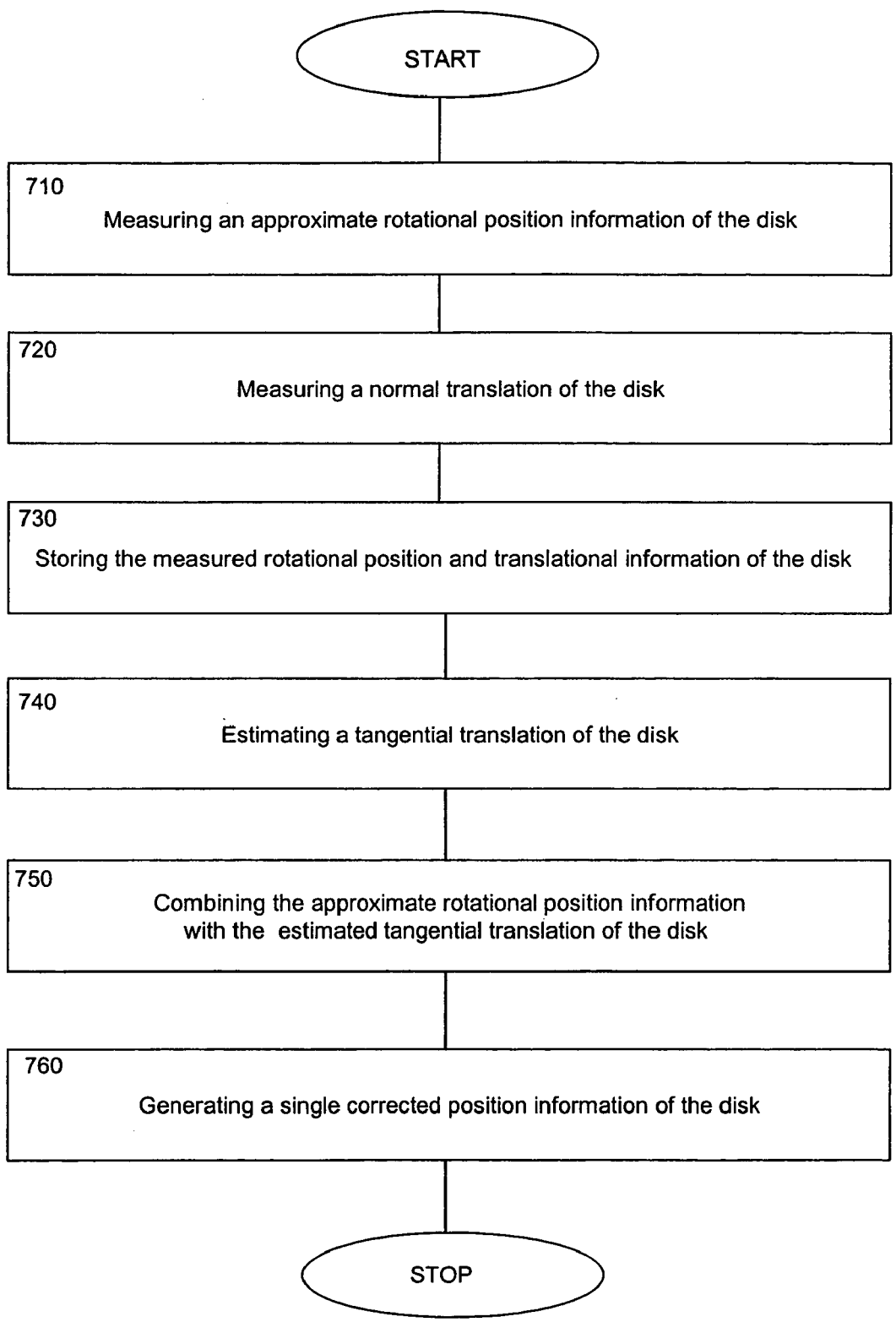
FIG. 7 is a flow chart illustrating a method according to the present invention.

FIG. 7 illustrates steps performed by the kit encoder 90 of the present invention to obtain the corrected position information of the disk 30. The encoder measures the approximate rotational position information of the disk (step 710) and the normal translation of the disk (step 720). The measured information may be stored in a memory (step 730). Subsequently, the encoder estimates the tangential translation of the disk using the measured normal translation of the disk (step 740). The encoder then combines (step 750) the stored information obtained at steps 710 and 720 to generate a single corrected position value (step 760). The single corrected position value may be provided to motor control electronics in standard encoder format for further control of the motor system 100. Advantageously, a user of the motor control system according to the invention is not required to perform any signal processing to obtain the correct position information.

Although illustrative embodiments of the present invention, and various modifications thereof, have been described in detail herein with reference to the accompanying drawings, it is to be understood that the invention is not limited to these embodiments and the described modifications, and that various changes and further modifications may be effected therein by one skilled in the art without departing from the scope or spirit of the invention, which is defined in the claims, below. For an example, while a transmissive type kit encoder is used as an embodiment of the present invention, this invention may also be applied easily to a reflective type encoder without significant modification. Additionally, while the transmissive type encoder utilizes an optical interference to measure the rotational position and eccentric motion using a light source, a patterned disk, a patterned mask and an optical sensor, other types of interference may be used as well within the scope of the invention. For example, a magnetic interference may be utilized using an electromagnetic sensor and patterned disk in which the disk pattern is electrically excited by electric pulses.

What is claimed is:

1. An encoder for evaluating rotational movement of a shaft of a motor system, comprising:
   a light source for emitting a light beam along a light path;
   a patterned disk concentrically attached to the shaft and placed in the light path, wherein the patterned disk having both a radial line pattern and a circular line pattern for modulating the light beam in response to rotation and translation of the shaft;
   a patterned mask positioned in the light path and having line patterns associated with each of the radial line pattern and the circular line pattern of the patterned disk; and
   an integrated sensor positioned in the light path and having detectors associated with the line patterns of the patterned masks,
   wherein said patterned disk and said patterned mask provide directional information for rotational movement of said patterned disk.

2. The encoder as in claim 1, wherein the light source is one of a light emitting diode (LED) and a laser diode (LD).

3. The encoder as in claim 1, wherein the shape of the radial line pattern of the patterned disk is an arc.

4. The encoder as in claim 1, wherein the radial line pattern of the patterned disk is positioned at the inner side and the circular line pattern of the patterned disk is positioned at the outer side of the patterned disk.

5. The encoder as in claim 1, wherein each of the line patterns of the patterned mask is composed of a first and second slit arrays having a plurality of line patterns through which the light beam is transmitted.

6. The encoder as in claim 5, wherein each of the first line array is shifted by a predetermined angle compared to the second line array.

7. The encoder as in claim 6, wherein the predetermined angle is 90°.

8. The encoder as in claim 1, wherein at least one of the detectors is adapted to sense direction of rotation of the patterned disk.

9. The encoder as in claim 1, wherein at least one of the detectors is adapted to sense direction of eccentric movement of the patterned disk.

10. The encoder as in claim 9, further comprising a memory that stores a value corresponding to eccentric movement of the patterned disk.

11. The encoder as in claim 10, further comprising a microprocessor that continuously updates the value of the eccentric movement.

12. The encoder as in claim 11, wherein the integrated sensor is formed on the same substrate as the microprocessor thereby forming a single chip.

13. A method of evaluating position information for a shaft of a motor system using an encoder having a light source for emitting a light beam along a light path, a patterned disk concentrically attached to the shaft, a patterned mask, the patterned disk and the patterned mask being in the light path, and an integrated sensor, the method comprising:
   measuring rotational movement of the patterned disk with the integrated sensor thereby generating position information for the shaft;
   measuring a first translational movement of the patterned disk;
   calculating a second translational movement of the patterned disk using information from the first translational movement of the patterned disk;
   combining the rotational movement information and the calculated second translational movement information of the patterned disk; and
   generating a single corrected position information for the patterned disk compensating for the second translational movement of the patterned disk.

14. The method according to claim 13, further comprising measuring direction of rotational movement of the patterned disk.

15. The method according to claim 13, further comprising measuring the direction of the first translational movement of the patterned disk.

16. The method according to claim 13, wherein the first translational movement does not substantially affect measurement accuracy of the position information of the patterned disk and the second translational movement does substantially affect measurement accuracy of the position information of the patterned disk.

17. The method according to claim 16, wherein the first translational movement is a normal translational movement and the second translational movement is a tangential translational movement of the patterned disk.

18. The method according to claim 13, wherein the combining step is according to the formula:

$$\theta_{OUTPUT} = \theta_{AQB} + \sin(\theta_{AQB} + \theta_{OFFSET}) \times P_{TT}/T_{RADIUS}$$

where $\theta_{OUTPUT}$ is corrected position information of the disk, $\theta_{AQB}$ is an uncorrected position information, $\theta_{OFFSET}$ is the offset angle of the eccentric motion with respect to 0° on the disk, $P_{TT}$ is a the magnitude of tangential translation of the disk, and $T_{RADIUS}$ is a radius of the circular pattern on the disk.

19. An encoder for evaluating a position information of a shaft of a motor system having a light source for emitting a light beam along a light path, a patterned disk concentrically attached to the shaft, a patterned mask, the patterned disk and the patterned mask being in the light path, and an integrated sensor, the encoder comprising:
   means for measuring a rotational movement of the patterned disk with the integrated sensor thereby generating position information for the shaft;
   means for measuring a first translational movement of the patterned disk;
   means for calculating a second translational movement of the patterned disk using information from the means for measuring a first translational movement of the patterned disk;
   means for combining the position information and the calculated second translational movement information of the patterned disk; and
   means for generating a single corrected position information of the patterned disk compensating for the second translational movement of the patterned disk.

20. The encoder according to claim 19, further comprising means for measuring the direction of the rotational movement of the patterned disk.

21. The encoder according to claim 19, further comprising means for measuring direction of the first translational movement of the patterned disk.

22. The encoder according to claim 19, wherein the first translational movement does not substantially affect measurement accuracy of the position information of the patterned disk and the second translational movement does substantially affect the measurement accuracy of the position information of the patterned disk.

23. The encoder according to claim 22, wherein the first translational movement is a normal translational movement and the second translational movement is a tangential translational movement.

24. The encoder according to claim 22, wherein the means for combining step is according to the formula:

$$\theta_{OUTPUT} = \theta_{AQB} + \sin(\theta_{AQB} + \theta_{OFFSET}) \times P_{TT}/T_{RADIUS}$$

where $\theta_{OUTPUT}$ is corrected position information of the disk, $\theta_{AQB}$ is an uncorrected position information, $\theta_{OFFSET}$ is the offset angle of the eccentric motion with respect to 0° on the disk, $P_{TT}$ is a tangetnail translation caused by the tangential translation of the disk, and $T_{RADIUS}$ is a radius of the circular pattern on the disk.

25. A computer-readable medium for evaluating position information for a shaft of a motor system using an encoder having a light source for emitting a light beam along a light path, a patterned disk concentrically attached to the shaft, a patterned mask, the patterned disk and the patterned mask being in the light path, and an integrated sensor, the medium comprising code that, when executed, causes a computer to carry out the steps of:
   measuring a rotational movement of the patterned disk with the integrated sensor thereby generating a position information of the shaft;
   measuring a first translational movement of the patterned disk;
   calculating a second translational movement of the patterned disk using information from the measured first translational movement of the patterned disk;
   combining the position information and the calculated second translational movement information of the patterned disk; and
   generating a single corrected position information of the patterned disk compensating for the second translational movement of the patterned disk.

26. The computer-readable medium of claim 25, further comprising code that, when executed, causes a computer to carry out the step of measuring the direction of the rotational movement of the patterned disk.

27. The computer-readable medium of claim 25, further comprising code that, when executed, causes a computer to carry out the step of measuring the direction of the translational movement of the patterned disk.

28. The computer-readable medium of claim 25, wherein the first translational movement does not affect measurement accuracy of the position information of the patterned disk and the second translational movement does affect the measurement accuracy of the position information of the patterned disk.

29. The computer-readable medium of claim 28, wherein the first translational movement is a normal translational movement and the second translational movement is a tangential translational movement.

30. The computer-readable medium of claim 25, wherein the combining step is according to the formula:

$$\theta_{OUTPUT} = \theta_{AQB} + \sin(\theta_{AQB} + \theta_{OFFSET}) \times P_{TT}/T_{RADIUS}$$

where $\theta_{OUTPUT}$ is corrected position information of the disk, $\theta_{AQB}$ is an uncorrected position information, $\theta_{OFFSET}$ is the offset angle of the eccentric motion with respect to 0° on the disk, $P_{TT}$ is a translation caused by the tangential translation of the disk, and $T_{RADIUS}$ is a radius of the circular pattern on the disk.

* * * * *